(12) United States Patent
Hwang (10) Patent No.: US 8,440,995 B2
(45) Date of Patent: May 14, 2013

(54) LIGHT EMITTING DEVICE, METHOD OF MANUFACTURING THE SAME, LIGHT EMITTING DEVICE PACKAGE AND LIGHTING SYSTEM

(75) Inventor: Sung Min Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/071,659

(22) Filed: Mar. 25, 2011

(65) Prior Publication Data

US 2011/0233517 A1 Sep. 29, 2011

(30) Foreign Application Priority Data

Mar. 26, 2010 (KR) .................. 10-2010-0027488

(51) Int. Cl.
*H01L 33/06* (2010.01)
*H01L 29/06* (2006.01)
*H01L 31/00* (2006.01)

(52) U.S. Cl.
USPC .................................... 257/13; 257/E33.008

(58) Field of Classification Search ............... 257/13, 257/E33.008
See application file for complete search history.

(56) References Cited

U.S. PATENT DOCUMENTS

| 6,455,343 | B1 | 9/2002 | Chen et al. ............ 438/40 |
| 8,309,972 | B2 | 11/2012 | Shum et al. ............ 257/79 |
| 2003/0203629 | A1 | 10/2003 | Ishibashi et al. ............ 438/689 |
| 2005/0212002 | A1* | 9/2005 | Sanga et al. ............ 257/96 |
| 2008/0067497 | A1* | 3/2008 | Kim ............ 257/13 |
| 2008/0237605 | A1 | 10/2008 | Murata et al. ............ 257/76 |
| 2009/0108250 | A1* | 4/2009 | Kim et al. ............ 257/13 |
| 2010/0123166 | A1* | 5/2010 | Bae ............ 257/103 |
| 2011/0272670 | A1* | 11/2011 | Kawaguchi et al. ............ 257/13 |

FOREIGN PATENT DOCUMENTS

| CN | 101438423 A | 5/2009 |
| CN | 101510580 A | 8/2009 |
| KR | 10-0538313 B1 | 12/2005 |
| KR | 10-0604423 B1 | 7/2006 |
| KR | 10-2009-0021933 A | 3/2009 |
| KR | 10-2009-0043057 A | 5/2009 |
| KR | 10-0897605 B1 | 5/2009 |

OTHER PUBLICATIONS

Korean Office Action dated Jan. 6, 2011 issued in Application No. 10-2010-0027488.
Chinese Office Action dated Jan. 4, 2013 issued in Application No. 201110078818.1.

* cited by examiner

*Primary Examiner* — William D Coleman
*Assistant Examiner* — Christine Enad
(74) *Attorney, Agent, or Firm* — KED & Associates LLP (57) ABSTRACT

A light emitting device is provided that includes a light emitting structure including a first conductive semiconductor layer, an active layer on the first conductive semiconductor layer, a second conductive semiconductor layer on the active layer, a superlattice structure layer on the second conductive semiconductor layer, and a third conductive semiconductor layer on the superlattice structure layer; a light transmission electrode layer on the light emitting structure; a first electrode connected to the first conductive semiconductor layer; a second electrode electrically connected to the light transmission electrode layer on the light emitting structure; and an insulating layer that extends from a lower portion of the second electrode to an upper portion of the second conductive semiconductor layer.

20 Claims, 9 Drawing Sheets

LIGHT EMITTING DEVICE, METHOD OF MANUFACTURING THE SAME, LIGHT EMITTING DEVICE PACKAGE AND LIGHTING SYSTEM

CROSS-REFERENCE TO RELATED APPLICATION

The present application claims priority of Korean Patent Application No. 10-2010-0027488 filed on Mar. 26, 2010, which is hereby incorporated by reference in its entirety.

BACKGROUND

The embodiment relates to a light emitting device, a method of manufacturing the same, a light emitting device package, and a lighting system.

A light emitting diode (LED) includes a p-n junction diode having a characteristic of converting electric energy into light energy. The p-n junction diode can be formed by combining group III and group V elements of the periodic table. The LED can represent various colors by adjusting the compositional ratio and materials of compound semiconductors.

When forward voltage is applied to the LED, electrons of an n layer are combined with holes of a p layer, so that photo energy corresponding to an energy gap between a conduction band and a valance band may be generated.

In particular, blue, green, and UV LEDs employing a nitride semiconductor have already been developed and extensively used.

SUMMARY

The embodiment provides a light emitting device having a novel structure, a method of manufacturing the same, a light emitting device package, and a lighting system.

The embodiment provides a light emitting device capable of reducing light loss, a method of manufacturing the same, a light emitting device package, and a lighting system.

A light emitting device according to the embodiment may include a light emitting structure including a first conductive semiconductor layer, an active layer on the first conductive semiconductor layer, a second conductive semiconductor layer on the active layer, a superlattice structure layer on the second conductive semiconductor layer, and a third conductive semiconductor layer on the superlattice structure layer; a light transmission electrode layer on the light emitting structure; a first electrode connected to the first conductive semiconductor layer; a second electrode electrically connected to the light transmission electrode layer on the light emitting structure; and an insulating layer extending from a lower portion of the second electrode to an upper portion of the second conductive semiconductor layer.

A light emitting device according to the embodiment may include a light emitting structure including a first conductive semiconductor layer, an active layer on the first conductive semiconductor layer, a second conductive semiconductor layer on the active layer, a superlattice structure layer on the second conductive semiconductor layer, and a third conductive semiconductor layer on the superlattice structure layer; a light transmission electrode layer on the light emitting structure; a first electrode connected to the first conductive semiconductor layer; a second electrode electrically connected to the light transmission electrode layer on the light emitting structure; and an insulating layer under the second electrode, wherein the second electrode and the light transmission electrode layer directly make contact with a top surface of the insulating layer.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the light emitting device according to the embodiments will be described in detail with reference to accompanying drawings.

Figure 1:
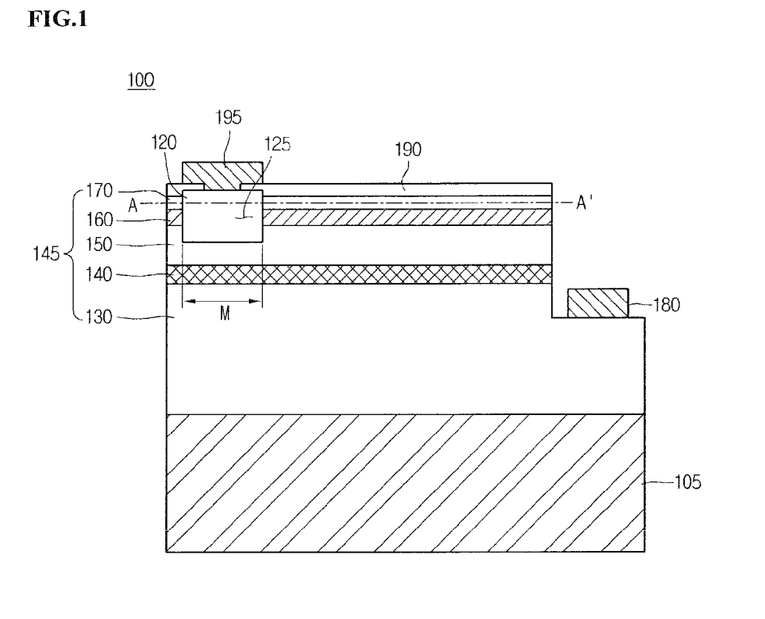
FIG. 1 is a side sectional view of a light emitting device according to the embodiment.
Figure 2:
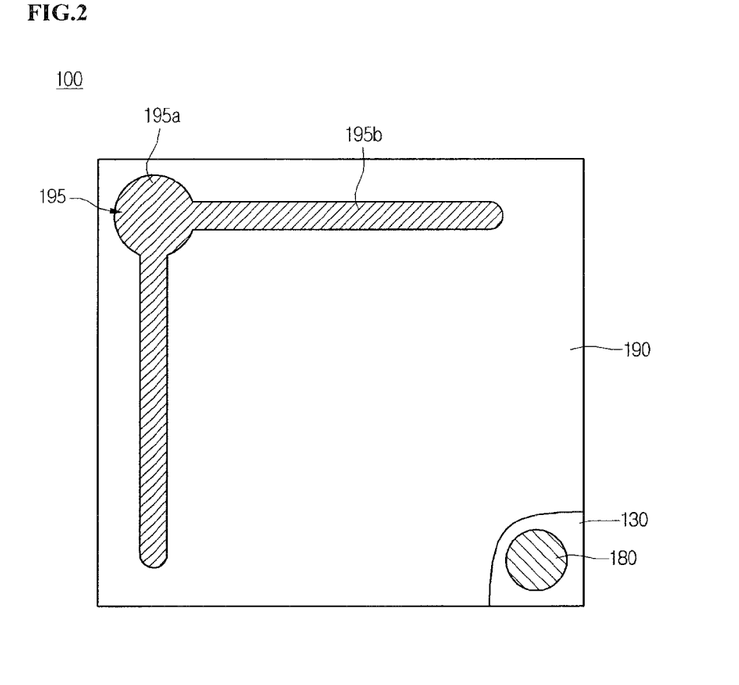
FIG. 2 is a top view of the light emitting device shown in FIG. 1.

FIG. 1 is a side sectional view of a light emitting device according to the embodiment, and FIG. 2 is a top view of the light emitting device shown in FIG. 1.

Referring to FIGS. 1 and 2, the light emitting device 100 according to the embodiment includes a substrate 105, a first conductive semiconductor layer 130 on the substrate 105, an active layer 140 on the first conductive semiconductor layer 130, a second conductive semiconductor layer 150 on the active layer 140, a superlattice structure layer 160 on the second conductive semiconductor layer 150, a insulating layer 120 on the second conductive semiconductor layer 150, a third conductive semiconductor layer 170 on the superlattice structure layer 160, a light transmission electrode layer 190 on the third conductive semiconductor layer 170, a first electrode 180 on the first conductive semiconductor layer 130, and a second electrode 195 electrically connected to the light transmission electrode layer 190 on the insulating layer 120.

The first conductive semiconductor layer 130, the active layer 140, the second conductive semiconductor layer 150, the superlattice structure layer 160 and the third conductive semiconductor layer 170 may constitute a light emitting structure 145 that generates the light.

The substrate may include a material having a light transmission property. For instance, the substrate 105 may include at least one of $Al_2O_3$, a single crystalline substrate, SiC, GaAs, GaN, ZnO, MN, Si, GaP, InP, and Ge, but the embodiment is not limited thereto. The substrate 105 may be a growth substrate on which the light emitting structure 145 is grown.

A top surface of the substrate 105 may be inclined or formed with a plurality of protrusion patterns to facilitate the growth of the light emitting structure 145 and to improve the light extraction efficiency of the light emitting device. For example, the protrusion patterns may have one of a semispherical shape, a polygonal shape, a triangular pyramid shape, and a nano-column shape.

The first conductive semiconductor layer 130, the active layer 140, the second conductive semiconductor layer 150, the superlattice structure layer 160 and the third conductive semiconductor layer 170 may be sequentially formed on the substrate 105, but the embodiment is not limited thereto. A buffer layer (not shown) and/or an undoped nitride layer (not shown) can be formed between the light emitting structure 145 and the substrate 105 to attenuate the lattice mismatch.

The light emitting structure 145 can be formed by using group III-V compound semiconductors. For instance, the light emitting structure 145 may include compound semiconductor materials, such as AlInGaN, GaAs, GaAsP or GaP and can generate the light as the electrons and holes supplied from the first and second conductive semiconductor layers 130 and 150 are recombined at the active layer 140.

The first conductive semiconductor layer 130 may include an n type semiconductor layer. The n type semiconductor layer may include a semiconductor material having a compositional formula of InxAlyGa1-x-yN ($0 \leq x \leq 1$, $0 \leq y \leq 1$, $0 \leq x+y \leq 1$). For example, the first conductive semiconductor layer 130 may include a material selected from the group consisting of GaN, MN, AlGaN, InGaN, InN, InAlGaN, and AlInN. The first conductive semiconductor layer 130 may be doped with n type dopant, such as Si, Ge, and Sn.

The first conductive semiconductor layer 130 can be formed by injecting trimethyl gallium (TMGa) gas, ammonia ($NH_3$) gas, and silane ($SiH_4$) gas into a chamber together with hydrogen (H2) gas. In addition, the first conductive semiconductor layer 130 can be prepared as a single layer or a multiple layer.

The active layer 140 may be formed on the first conductive semiconductor layer 130. The active layer 140 may generate light having a wavelength band determined by the intrinsic energy band of the compound semiconductor material through the recombination of the electrons and the holes provided from the first and second conductive semiconductor layers 130 and 150, respectively.

For instance, the active layer 140 may include a semiconductor material having a compositional formula of InxAlyGa1-x-yN ($0 \leq x \leq 1$, $0 \leq y \leq 1$, $0 \leq x+y \leq 1$). The active layer 140 may include one of a single quantum well structure, a multiple quantum well (MQW) structure, a quantum wire structure or a quantum dot structure. In detail, the active layer 140 can be formed by alternately stacking a well layer and a barrier layer including group III-V compound semiconductor materials. For instance, the active layer 140 may include a stack structure of an InGaN well layer and a GaN barrier layer, or an InGaN well layer and an AlGaN barrier layer.

The active layer 140 can be formed by injecting trimethyl gallium (TMGa) gas, trimethyl indium (TMIn) gas, and ammonia ($NH_3$) gas into a chamber together with hydrogen (H2) gas.

A conductive clad layer can be formed on and/or under the active layer 140. The conductive clad layer may include an AlGaN-based semiconductor.

The second conductive semiconductor layer 150 may be formed on the active layer 140. For instance, the second conductive semiconductor layer 150 may include a p type semiconductor layer including a semiconductor material having the compositional formula of $In_xAl_yGa_{1-x-y}N$ ($0 \leq x \leq 1$, $0 \leq y \leq 1$, $0 \leq x+y \leq 1$). In detail, the p type semiconductor layer may include one selected from the group consisting of GaN, MN, AlGaN, InGaN, InN, InAlGaN, and AlInN. In addition, the p type semiconductor layer may be doped with a p type dopant, such as Mg, Zn, Ca, Sr, or Ba.

The second conductive semiconductor layer 150 can be formed by injecting TMGa gas, $NH_3$ gas, and (EtCp$_2$Mg){Mg($C_2H_5C_5H_4$)$_2$} gas into the chamber together with the hydrogen gas. The second conductive semiconductor layer 150 can be prepared as a single layer or a multiple layer.

The superlattice structure layer 160 may be foamed on the second conductive semiconductor layer 150. The superlattice structure layer 160 may include the group III-V compound semiconductor materials. For instance, the superlattice structure layer 160 can be formed by alternately stacking a GaN layer and an AlGaN layer. In addition, the superlattice structure layer 160 can be doped with a p type dopant, such as Mg or Zn.

The superlattice structure layer 160 may improve the crystalline property of the third conductive semiconductor layer 170 formed on the superlattice structure layer 160. For instance, the superlattice structure layer 160 is formed by alternately stacking the GaN layer and the AlGaN layer and the defect or the dislocation can be reduced as the GaN layer and the AlGaN layer are repeatedly stacked.

Since the AlGaN layer of the superlattice structure layer 160 has relatively high resistance, the current is spread in the light emitting structure 145. In detail, the superlattice structure layer 160 can spread the current flowing through the light emitting structure 145, thereby preventing the current from being concentrated on the shortest path between the first electrode 180 and the second electrode 190.

The third conductive semiconductor layer 170 may be formed on the superlattice structure layer 160. The third conductive semiconductor layer 170 may include group III-V compound semiconductor materials doped with a second conductive dopant. For instance, the third conductive semiconductor layer 170 may include one selected from the group consisting of GaN, AlN, AlGaN, InGaN, InN, InAlGaN, AlInN, AlGaAs, GaP, GaAs, GaAsP, and AlGaInP.

If the second conductive semiconductor layer 150 is a p type semiconductor layer, the third conductive semiconductor layer 170 may be a p type semiconductor layer. Thus, the third conductive semiconductor layer 170 may be doped with a p type dopant, such as Mg or Zn. In addition, the third conductive semiconductor layer 170 can be prepared as a single layer or a multiple layer.

Meanwhile, an n type semiconductor layer may be formed on the third conductive semiconductor layer 170. The first conductive semiconductor layer may include a p type semiconductor layer, and the second and third conductive semiconductor layers 150 and 170 may include an n type semiconductor layer. Thus, the light emitting structure 145 may include at least one of an NP, PN, NPN, PNP junction structures, but the embodiment is not limited thereto. In addition, the doping concentration of impurities in the first to third conductive semiconductor layers 130, 150 and 170 may be regular or irregular. In other words, the light emitting structure 145 may have various structures, but the embodiment is not limited thereto.

The insulating layer 120 may be formed on the second conductive semiconductor layer 150. At least a part of the insulating layer 120 may overlap with the second electrode 195 in the vertical direction. In addition, at least a part of a lateral side of the insulating layer 120 may overlap with the superlattice structure layer 160 in the horizontal direction.

That is, the lateral side of the insulating layer 120 can make contact with the superlattice structure layer 160 as well as the second and third conductive semiconductor layers 150 and 170. In addition, a top surface of the insulating layer 120 can make contact with the second electrode 195.

Figure 3:
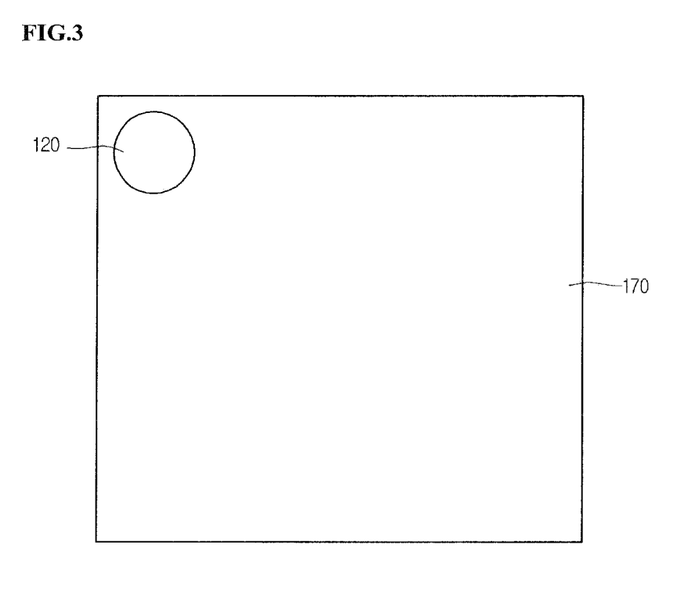
FIGS. 3 and 4 are views showing examples of A-A' plane of the light emitting device shown in FIG. 1.
Figure 4:
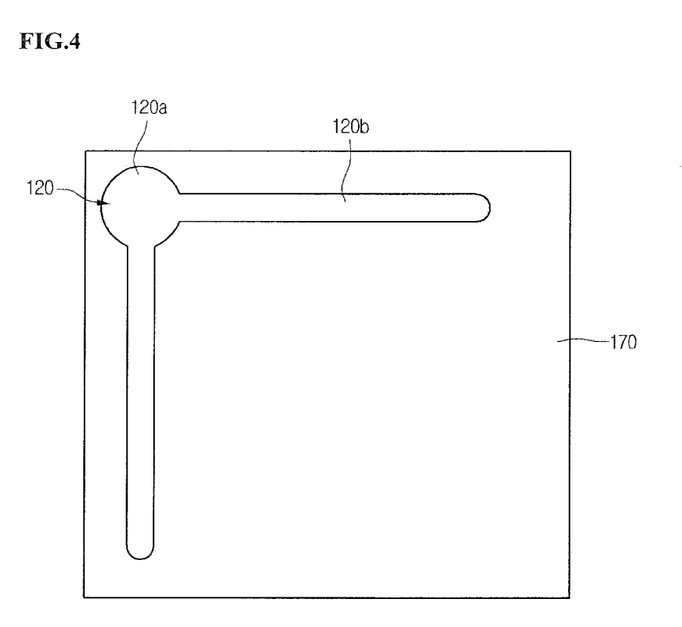

FIGS. 3 and 4 are views showing examples of A-A' plane of the light emitting device shown in FIG. 1. Hereinafter, the configuration of the insulating layer 120 will be described in detail with reference to FIGS. 3 and 4.

Referring to FIGS. 2 to 4, the second electrode 195 may include an electrode pad 195a, to which a wire is bonded, and a branch 195b branching from the electrode pad 195a to spread the current. In addition, the insulating layer 120 is formed on the second conductive semiconductor layer 150 corresponding to the second electrode 195.

For instance, as shown in FIG. 3, the insulating layer 120 is positioned corresponding to the electrode pad 195a.

In addition, as shown in FIG. 4, the insulating layer 120 can be positioned corresponding to the electrode pad 195a and the branch 195b.

That is, the insulating layer 120 may be positioned corresponding to the second electrode 195 or a part of the second electrode 195, but the embodiment is not limited thereto.

Referring to FIGS. 1 to 4, the insulating layer 120 may include a material having an electric insulating property. For instance, the insulating layer 120 may include at least one selected from a group consisting of $SiO_2$, $SiO_x$, $SiO_xN_y$, $Si_3N_4$, $Al_2O_3$, $MgF_2$, $ZrO_2$, $TaBO_3$ and $TiO_x$. A width of the insulating layer 120 may be equal to or smaller than a width of the electrode pad. In addition, the width of the insulating layer 120 may be equal to or smaller than the width of the electrode pad and the branch.

In addition, a metallic material forming a non-ohmic contact, such as a Schottky contact, with respect to the second and third conductive semiconductor layers 150 and 170 and the superlattice structure layer 160 can be formed on the insulating layer 120, but the embodiment is not limited thereto. If the metallic layer has the light transmission property, the metallic layer may substitute for the insulating layer 120.

In order to form the insulating layer 120, a recess 125 is formed such that a top surface of the second conductive semiconductor layer 150 can be partially exposed and then a deposition process is performed with respect to the recess 125.

In the process of forming the recess 125, the superlattice structure layer 160 is removed from a region below the second electrode 195. Thus, the current spreading effect of the superlattice structure layer 160 may be weak in the region below the second electrode 195.

Therefore, the quantity of light generated from the first region M of the active layer 140 located below the second electrode 195 may be smaller than the quantity of light generated from other regions of the active layer 140. In other words, the quantity of the light generated from the first region M of the active layer 140 located below the second electrode 195 can be reduced and the quantity of the light generated from other regions of the active layer 140 can be increased by forming the insulating layer 120.

If the quantity of the light generated from the first region M of the active layer 140 is reduced, the loss of light, which is generated from the first region M and absorbed in the second electrode 195, can be reduced.

In detail, when the second electrode 195 is formed by using an opaque metallic material, light loss may increase as the quantity of the incident light directed to the second electrode 195 is increased. However, according to the embodiment, the insulating layer 120 is formed in the light emitting device 100, so that the quantity of the light generated from the first region M located below the second electrode 195 can be reduced. As a result, the loss of light, which is caused by the light absorbed in the second electrode 195, can be minimized.

In addition, according to the light emitting device 100 of the embodiment, the quantity of the light generated from the active layer 140 except for the first region M can be relatively increased, so that the light emitting efficiency of the light emitting device 100 can be improved.

Figure 5:
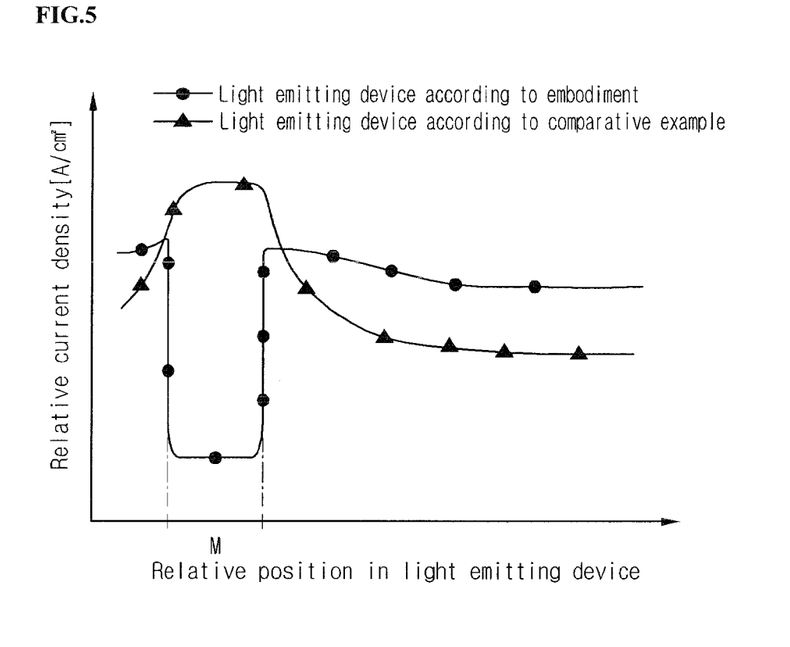
FIG. 5 is a graph showing relative current density in an active layer according to the relative position in the horizontal direction of the light emitting device shown in FIG. 1.

FIG. 5 is a graph showing relative current density in the active layer according to the relative position in the horizontal direction of the light emitting device 100 shown in FIG. 1. The light emitting device according to the comparative example is identical to the light emitting device 100 according to the embodiment except that the light emitting device has no insulating layer 120.

Referring to FIG. 5, the current density in the first region M of the active layer 140 is relatively lower than that of the comparative example, but the current density in other regions of the active layer 140 except for the first region M is relatively higher than that of the comparative example.

In other words, according to the light emitting device 100 of the embodiment, the current spreading in other regions of the active layer 140 except for the first region M may be smoothly performed as compared with the light emitting device according to the comparative example.

That is, as described above, since the insulating layer 120 is foamed according to the embodiment, the light loss can be minimized in the second electrode 195 and the quantity of the light generated from the active layer 140 except for the first region M can be increased.

Referring again to FIGS. 1 and 2, the light transmission electrode layer 190 may be formed on the third conductive semiconductor layer 170. In addition, the light transmission electrode layer 190 is formed on a part of the insulating layer 120. For instance, the light transmission electrode layer 190 can be formed on a part of a top surface of the insulating layer 120.

The light transmission electrode layer 190 may include a material having the light transmission property while forming an ohmic contact with respect to the third conductive semiconductor layer 170. For instance, the light transmission electrode layer 190 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, and Ni/$IrO_x$/Au/ITO. The light transmission electrode layer 190 may be prepared as a single layer structure or a multiple layer structure.

The second electrode 195 may be formed on the insulating layer 120 and electrically connected to the light transmission electrode layer 190. For instance, as shown in the drawing, the second electrode 195 may be formed on the insulating layer 120 and the light transmission electrode layer 190, but the embodiment is not limited thereto.

For instance, the second electrode 195 may include a metal or an alloy including at least one selected from a group consisting of Cu, Cr, Au, Al, Ag, Sn, Ni, Pt, and Pd.

The first electrode 180 may be formed on the first conductive semiconductor layer 130. For instance, the first electrode 180 can be formed after selectively removing the light emitting structure 145 such that a top surface of the first conductive semiconductor layer 130 can be partially exposed.

For instance, the first electrode 180 may include a metal or an alloy including at least one selected from a group consisting of Cu, Cr, Au, Al, Ag, Sn, Ni, Pt, and Pd.

The first and second electrodes 180 and 195 are electrically connected to an external light source to supply power to the light emitting device 100 according to the embodiment.

Figure 6:
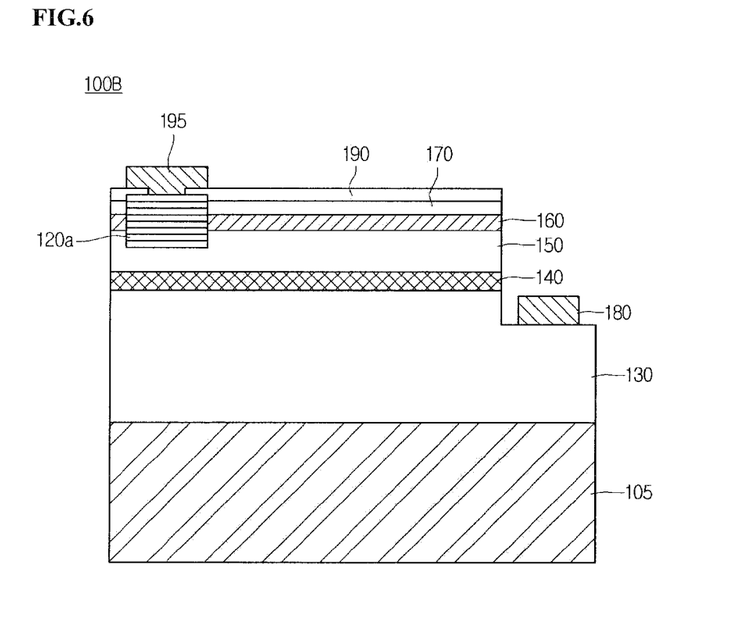
FIG. 6 is a side sectional view of a light emitting device according to another embodiment.
Figure 7:
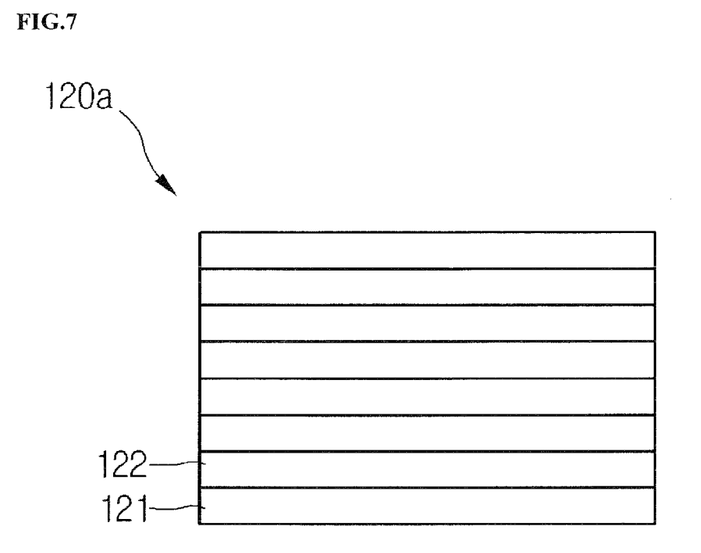
FIG. 7 is an enlarged view of an insulating layer of the light emitting device shown in FIG. 6.

FIG. 6 is a side sectional view of a light emitting device 100B according to another embodiment, and FIG. 7 is an enlarged view of an insulating layer 120a of the light emitting device 100B shown in FIG. 6.

The light emitting device 100B is identical to the light emitting device 100 shown in FIG. 1 except for the structure of the insulating layer 120a.

Referring to FIGS. 6 and 7, the light emitting device 100B includes a substrate 105, a first conductive semiconductor layer 130 on the substrate 105, an active layer 140 on the first conductive semiconductor layer 130, a second conductive semiconductor layer 150 on the active layer 140, a superlattice structure layer 160 on the second conductive semiconductor layer 150, an insulating layer 120a on the second conductive semiconductor layer 150, a third conductive semiconductor layer 170 on the superlattice structure layer 160, a light transmission electrode layer 190 on the third conductive semiconductor layer 170, and a second electrode 195 electrically connected to the light transmission electrode layer 190 on the insulating layer 120a.

As shown in FIG. 7, the insulating layer 120a may have a multiple layer structure in which at least two layers are repeatedly stacked.

For instance, the insulating layer 120a may have a multiple layer structure, in which at least one pair of a first layer 121 having a first refractive index and a second layer 122 having a second refractive index different from the first refractive index is stacked.

The thickness of the first and second layers 121 and 122 satisfies $\lambda/4$ nm (wherein, $\lambda$ is a wavelength of light emitted from the active layer 140, n is a refractive index of the first layer 121 or the second layer 122, and m is a natural number).

In this case, the insulating layer 120a may serve as a DBR (distributed bragg reflector), so that the light incident into the insulating layer 120a is effectively reflected, thereby increasing the quantity of the light extracted to the outside.

For instance, the first layer 121 includes at least one selected from a group consisting of $SiO_2$ and $MgF_2$ having a relatively low refractive index, and the second layer 122 includes at least one selected from a group consisting of $TiO_2$, $Si_3N_4$, $ZrO_2$, and $TaBO_3$ having a relatively high refractive index, but the embodiment is not limited thereto. For instance, $SiO_2$ has a thickness of about 77 nm, $TiO_2$ has a thickness of about 46 nm, and the refractive index (n) of at least one of the above materials is in the range of $1.5<n<1.78$.

Hereinafter, the method of manufacturing the light emitting device 100 according to the embodiment will be described in detail. In the following description, the elements and structures that have been described above will be omitted or briefly explained in order to avoid redundancy.

FIGS. 8 to 12 are sectional views showing the procedure for manufacturing the light emitting device 100 according to the embodiment.

Figure 8:
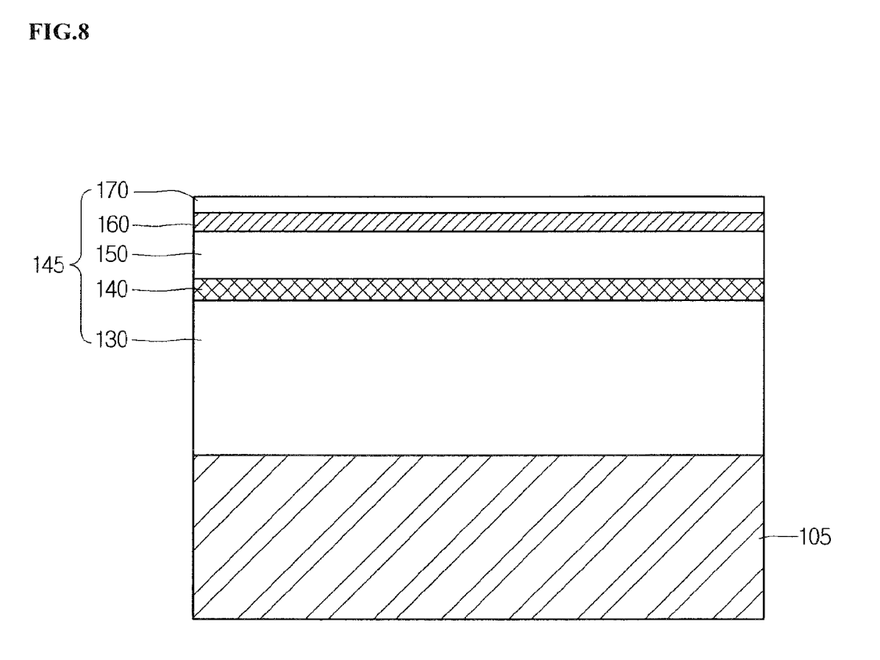
FIGS. 8 to 12 are sectional views showing the procedure for manufacturing a light emitting device according to the embodiment.

Referring to FIG. 8, the light emitting structure 145 is formed on the substrate 105.

For instance, the substrate 105 may include at least one of $Al_2O_3$, a single crystalline substrate, SiC, GaAs, GaN, ZnO, MN, Si, GaP, InP, and Ge, but the embodiment is not limited thereto.

The light emitting structure 145 can be formed by sequentially stacking the first conductive semiconductor layer 130, the active layer 140, the second conductive semiconductor layer 150, the superlattice structure layer 160 and the third conductive semiconductor layer 170 on the substrate 105.

For instance, the light emitting structure 145 can be formed through at least one of MOCVD (Metal Organic Chemical Vapor Deposition), CVD (Chemical Vapor Deposition), PECVD (Plasma-Enhanced Chemical Vapor Deposition), MBE (Molecular Beam Epitaxy) and HVPE (Hydride Vapor Phase Epitaxy), but the embodiment is not limited thereto.

Figure 9:
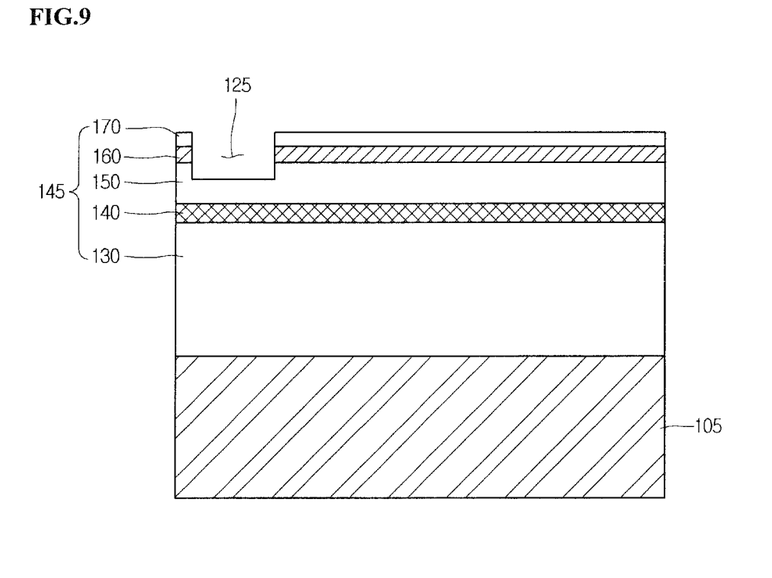

Referring to FIG. 9, the etching process is performed with respect to the light emitting structure 145 to form the recess 125 such that a part of the top surface of the second conductive semiconductor layer 150 can be exposed. As the recess 125 is formed, a part of the superlattice structure layer 160 may be removed.

Figure 10:
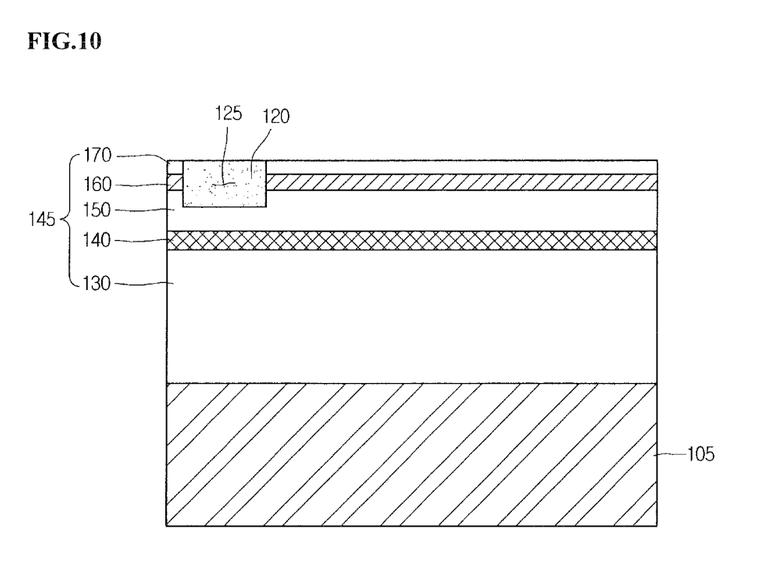

Referring to FIG. 10, the insulating layer 120 is formed in the recess 125. For instance, the insulating layer 120 can be formed through at least one of PECVD (Plasma Enhanced Chemical Vapor Deposition), E-beam deposition, and sputtering schemes, but the embodiment is not limited thereto.

Figure 11:
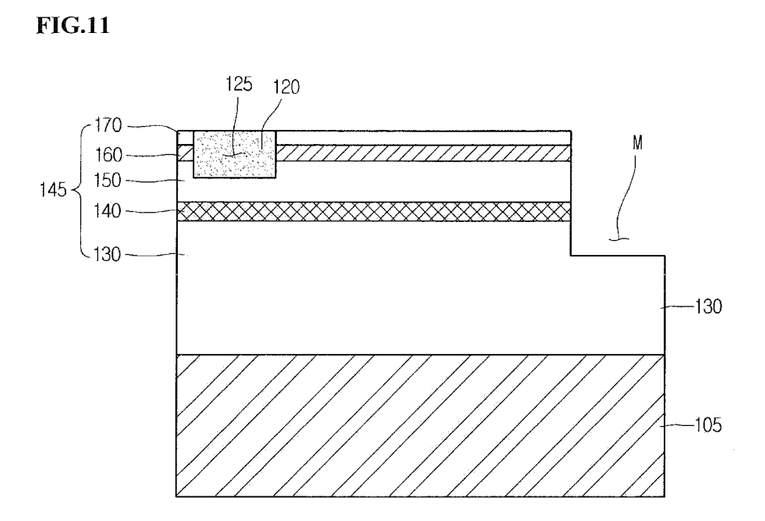

Referring to FIG. 11, the mesa etching process is performed with respect to the light emitting structure 145 to expose a part of the top surface of the second conductive semiconductor layer 130.

The mesa etching process may include a dry etching process, such as an ICP (Inductively Coupled Plasma) etching process, but the embodiment is not limited thereto.

Figure 12:
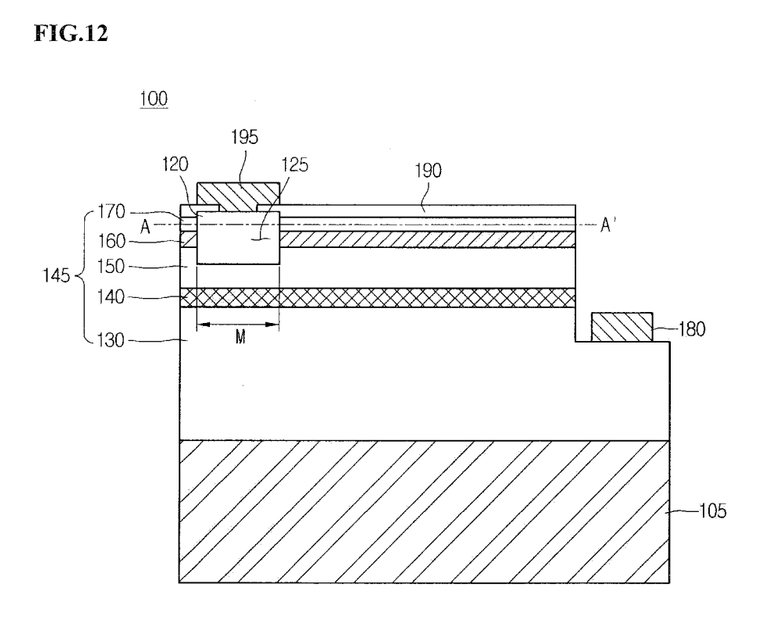

Referring to FIG. 12, the first electrode 180 is formed on the first conductive semiconductor layer 130, and the light transmission electrode layer 190 and the second electrode 195 are formed on the third conductive semiconductor layer 170, thereby forming the light emitting device 100 according to the embodiment.

At this time, the second electrode 195 may partially overlap with the insulating layer 120 in the vertical direction. In addition, the second electrode 195 may be electrically connected to the light transmission electrode layer 190.

For instance, the light transmission electrode layer 190 can be formed through the deposition process, such as E-beam deposition, sputtering or PECVD (Plasma Enhanced Chemical Vapor Deposition), but the embodiment is not limited thereto.

The first and second electrodes 180 and 195 can be formed through the deposition process or the plating process, but the embodiment is not limited thereto.

As described above, according to the light emitting device of the embodiment, the insulating layer is disposed between the second conductive semiconductor layer and the second electrode, so that the light emitting efficiency of the light emitting device can be improved.

Figure 13:
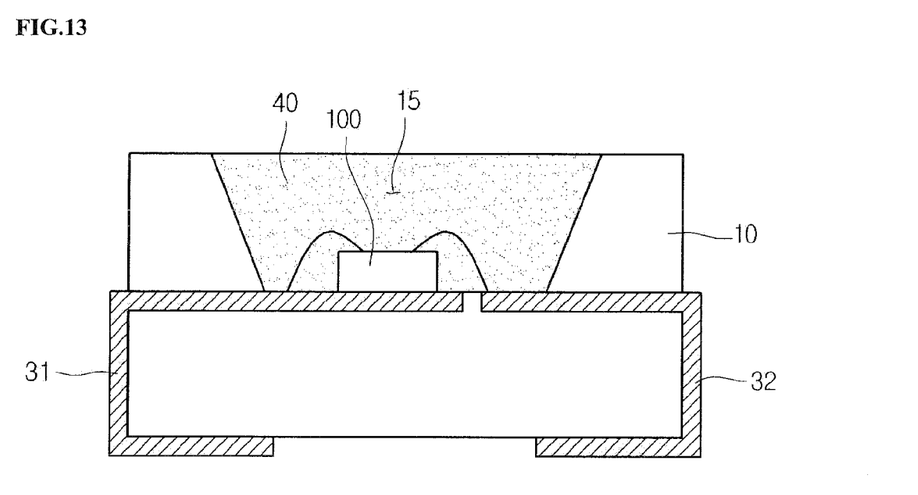
FIG. 13 is a side sectional view showing a light emitting device package including a light emitting device according to the embodiment.

FIG. 13 is a side sectional view showing a light emitting device package including a light emitting device according to the embodiment Referring to FIG. 13, the light emitting device package includes a body 10, first and second electrode layers 31 and 32 formed on the body 10, the light emitting device 100 according to the embodiment, which is provided on the body 10 and electrically connected to the first and second electrode layers 31 and 32 and a molding member 40 that surrounds the light emitting device 100.

The body 10 may include a silicon material, a synthetic resin material or a metallic material. An inclined surface may be formed around the light emitting device 100.

The first and second electrode layers 31 and 32 are electrically isolated from each other to supply power to the light emitting device 100. In addition, the first and second electrode layers 31 and 32 reflect the light emitted from the light emitting device 100 to improve the light efficiency and dissipate heat generated from the light emitting device 100 to the outside.

The light emitting device 100 can be installed on the body 10 or the first or second electrode layer 31 or 32.

The light emitting device 100 can be electrically connected to the first and second electrode layers 31 and 32 through a die bonding scheme or a flip chip scheme.

The molding member 40 surrounds the light emitting device 100 to protect the light emitting device 100. In addition, the molding member 40 may include luminescence materials to change the wavelength of the light emitted from the light emitting device 100.

At least one lens (not shown) may be formed on the molding member 40 or the body 10. The lens may include a convex lens, a concave lens or a concavo-convex lens.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 14:
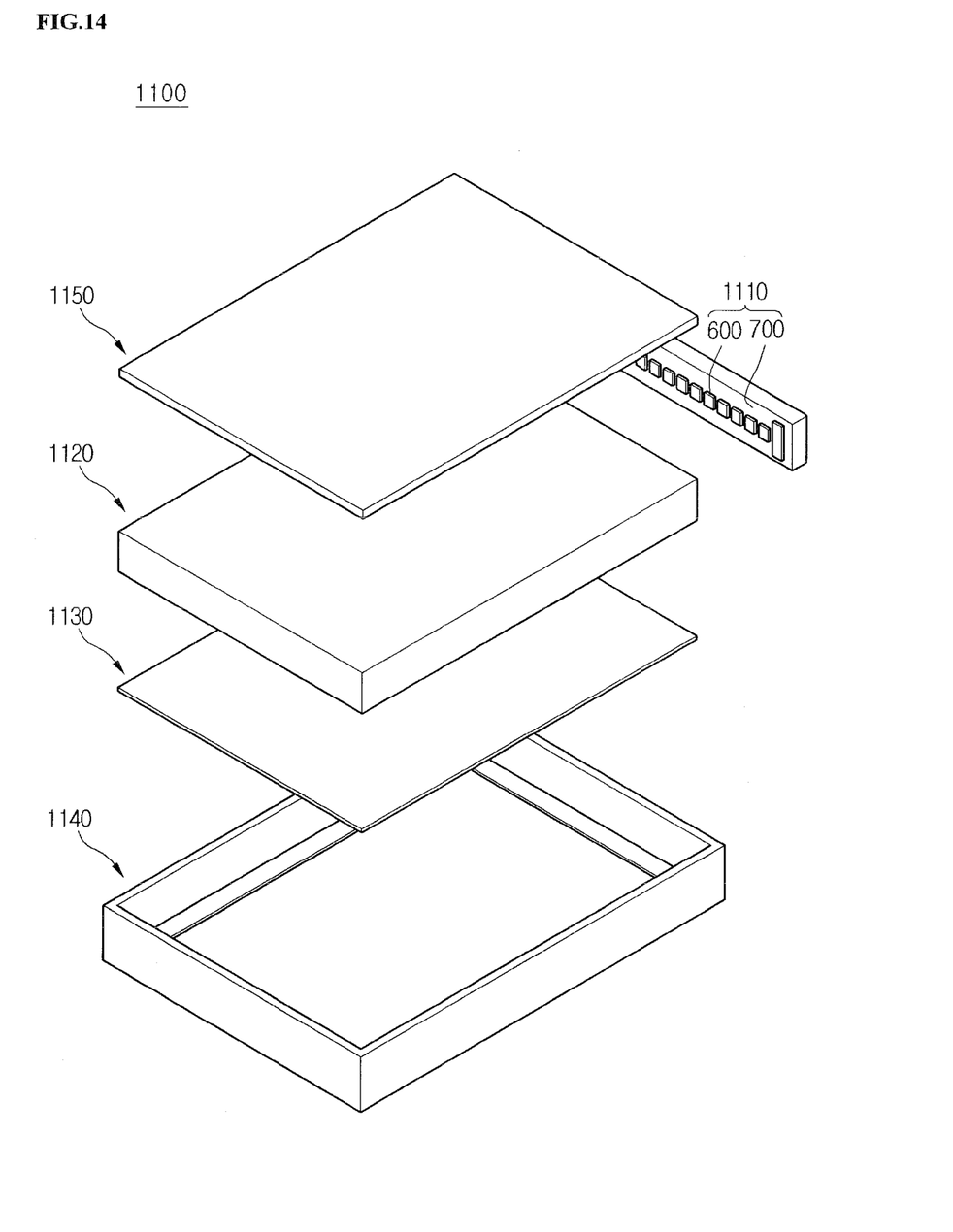
FIG. 14 is an exploded perspective view showing a backlight unit employing a light emitting device or a light emitting device package according to the embodiment.

FIG. 14 is an exploded perspective view showing a backlight unit 1100 including the light emitting device or the light emitting device package according to the embodiment. The backlight unit 1100 shown in FIG. 14 is an example of a lighting system and the embodiment is not limited thereto.

Referring to FIG. 14, the backlight unit 1100 includes a bottom frame 1140, a light guide member 1120 installed in the bottom frame 1140, and a light emitting module 1110 installed on at least one lateral side or a bottom surface of the light guide member 1120. In addition, a reflective sheet 1130 can be disposed under the light guide member 1120.

The bottom frame 1140 has a box shape having an open top surface to receive the light guide member 1120, the light emitting module 1110 and the reflective sheet 1130 therein. In addition, the bottom frame 1140 may include a metallic material or a resin material, but the embodiment is not limited thereto.

The light emitting module 1110 may include a substrate 700 and a plurality of light emitting device packages 600 installed on the substrate 700. The light emitting device packages 600 provide the light to the light guide member 1120. According to the light emitting module 1110 of the embodiment, the light emitting device packages 600 are installed on the substrate 700. However, it is also possible to direct install the light emitting device according to the embodiment on the substrate 700.

As shown in FIG. 14, the light emitting module 1110 is installed on at least one inner side of the bottom frame 1140 to provide the light to at least one side of the light guide member 1120.

In addition, the light emitting module 1110 can be provided below the bottom frame 1140 to provide the light toward the bottom surface of the light guide member 1120. Such an arrangement can be variously changed according to the design of the backlight unit 1100 and the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using one of acryl-based resin, such as PMMA (polymethyl methacrylate), PET (polyethylene terephthalate), PC (polycarbonate), COC and PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a light transmission plate or a light transmission film including luminescence materials.

The reflective sheet 1130 can be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 15:
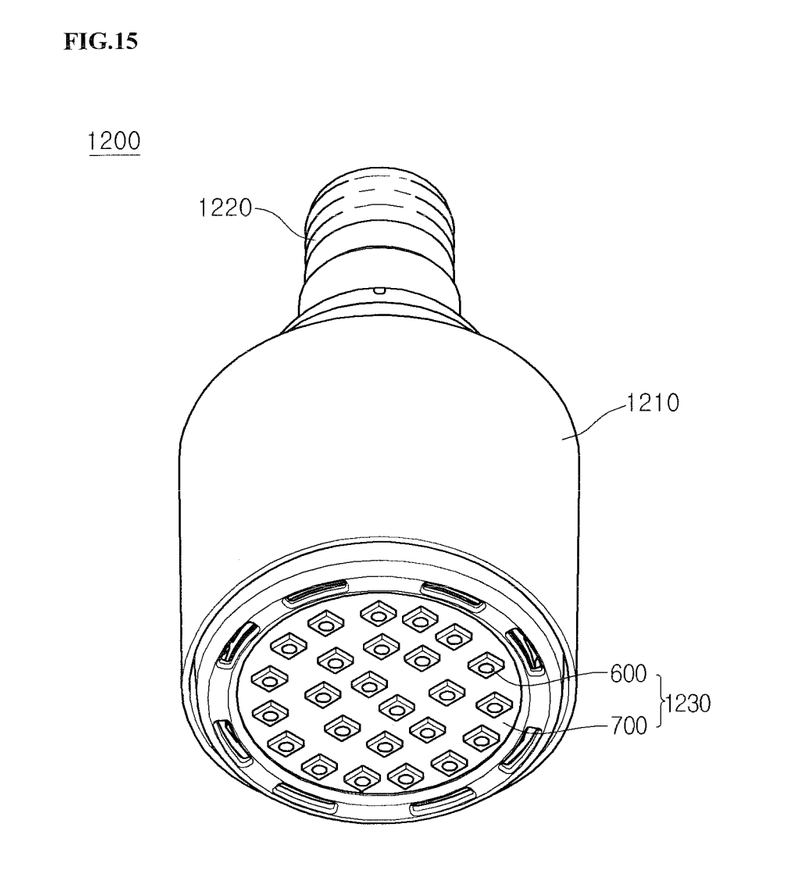
FIG. 15 is a perspective view showing a lighting unit employing a light emitting device or a light emitting device package according to the embodiment.

FIG. 15 is a perspective view showing a lighting unit 1200 including the light emitting device or the light emitting device package according to the embodiment. The lighting unit 1200 shown in FIG. 15 is an example of a lighting system and the embodiment is not limited thereto.

Referring to FIG. 15, the lighting unit 1200 includes a case body 1210, a light emitting module 1230 installed in the case body 1210, and a connection terminal 1220 installed in the case body 1210 to receive power from an external power source.

Preferably, the case body 1210 includes a material having superior heat dissipation property. For instance, the case body 1210 includes a metallic material or a resin material.

The light emitting module 1230 may include a substrate 700 and at least one light emitting device package 600 installed on the substrate 700. According to the embodiment, the light emitting device package 600 is installed on the substrate 700. However, it is also possible to direct install the light emitting device 200 according to the embodiment on the substrate 700.

The substrate 700 includes an insulating member printed with a circuit pattern. For instance, the substrate 700 includes a PCB (printed circuit board), an MC (metal core) PCB, a flexible PCB, or a ceramic PCB.

In addition, the substrate 700 may include a material that effectively reflects the light. The surface of the substrate 700 can be coated with a color, such as a white color or a silver color, to effectively reflect the light.

At least one light emitting device package 600 according to the embodiment can be installed on the substrate 700. Each light emitting device package 600 may include at least one LED (light emitting diode). The LED may include a colored LED that emits the light having the color of red, green, blue or white and a UV (ultraviolet) LED that emits UV light.

The LEDs of the light emitting module 1230 can be variously combined to provide various colors and brightness. For instance, the white LED, the red LED and the green LED can be combined to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescence materials. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 15, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as mentioned above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, the lighting system includes the light emitting device or the light emitting device package having superior light emitting efficiency, so that the lighting system can represent the superior light efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a light emitting structure including a first conductive semiconductor layer, an active layer on the first conductive semiconductor layer, a second conductive semiconductor layer on the active layer, a superlattice structure layer on the second conductive semiconductor layer, and a third conductive semiconductor layer on the superlattice structure layer;
a light transmission electrode layer on the light emitting structure;
a first electrode connected to the first conductive semiconductor layer;
a second electrode electrically connected to the light transmission electrode layer on the light emitting structure; and
an insulating layer that extends from a lower portion of the second electrode to an upper portion of the second conductive semiconductor layer, wherein a recess is formed under the second electrode and a portion of the light transmission electrode layer, wherein the recess is formed by removing portions of the third conductive semiconductor layer, the superlattice structure layer, and an upper portion of the second conductive semiconductor layer corresponding to the second electrode, and wherein the insulating layer is disposed in the recess so that the insulating layer contacts the second conductive semiconductor layer.

2. The light emitting device of claim 1, wherein the third conductive semiconductor layer includes a n type semiconductor or a p type semiconductor.

3. The light emitting device of claim 1, wherein at least a part of the insulating layer overlaps with the second electrode in a vertical direction.

4. The light emitting device of claim 1, wherein the second electrode includes an electrode pad and a branch that branches from the electrode pad.

5. The light emitting device of claim 4, wherein the insulating layer is disposed below the electrode pad.

6. The light emitting device of claim 5, wherein the insulating layer is disposed below the branch.

7. The light emitting device of claim 4, wherein the insulating layer has a width equal to or smaller than a width of the electrode pad and the branch.

8. The light emitting device of claim 1, wherein the insulating layer includes at least one selected from the group consisting of $SiO_2$, $SiO_x$, $SiO_xN_y$, $Si_3N_4$, $Al_2O_3$, $MgF_2$, $ZrO_2$, $TaBO_3$ and $TiO_x$.

9. The light emitting device of claim 1, further comprising a metallic material on the insulating layer, wherein the metallic material forms a non-ohmic contact with respect to the second conductive semiconductor layer, the third conductive semiconductor layer and the superlattice structure layer.

10. The light emitting device of claim 1, wherein the insulating layer has a multiple layer structure, in which a first layer having a first refractive index and a second layer having a second refractive index different from the first refractive index are repeatedly stacked by at least one time.

11. The light emitting device of claim 10, wherein a thickness of the first and second layers satisfies $\lambda/4n$ nm, in which $\lambda$ is a wavelength of the light emitted from the active layer, n is a refractive index of the first layer or the second layer, and m is a natural number.

12. The light emitting device of claim 10, wherein the first layer includes at least one selected from a group consisting of SiO$_2$ and MgF$_2$, and the second layer includes at least one selected from a group consisting of TiO$_2$, Si$_3$N$_4$, ZrO$_2$ and TaBO$_3$.

13. The light emitting device of claim 1, wherein the superlattice structure layer includes a GaN layer and an AlGaN layer, which are alternately stacked.

14. The light emitting device of claim 1, wherein the first conductive semiconductor layer, the active layer, the second conductive semiconductor layer, the superlattice structure layer and the third conductive semiconductor layer include a compound semiconductor comprising at least one selected from the group consisting of GaN, AlN, AlGaN, InGaN, InN, InAlGaN, AlInN, AlGaAs, GaP, GaAs, GaAsP and AlGaInP.

15. A light emitting device, comprising:
- a light emitting structure including a first conductive semiconductor layer, an active layer on the first conductive semiconductor layer, a second conductive semiconductor layer on the active layer, a superlattice structure layer on the second conductive semiconductor layer, and a third conductive semiconductor layer on the superlattice structure layer;
- a light transmission electrode layer on the light emitting structure;
- a first electrode connected to the first conductive semiconductor layer;
- a second electrode electrically connected to the light transmission electrode layer on the light emitting structure; and
- an insulating layer disposed in a recess under the second electrode, wherein a top surface of the insulating layer directly contacts the second electrode and the light transmission electrode layer, wherein the recess is formed under the second electrode and a portion of the light transmission electrode layer, wherein the recess is formed by removing portions of the third conductive semiconductor layer, the superlattice structure layer, and an upper portion of the second conductive semiconductor layer corresponding to the second electrode, and wherein the insulating layer is disposed in the recess so that the insulating layer contacts the second conductive semiconductor layer.

16. The light emitting device of claim 15, wherein the insulating layer extends from a lower portion of the second electrode to an upper portion of the second conductive semiconductor layer through the superlattice structure layer and the third conductive semiconductor layer.

17. The light emitting device of claim 15, wherein the second electrode includes an electrode pad and a branch that branches from the electrode pad.

18. The light emitting device of claim 17, wherein the insulating layer is disposed under the electrode pad.

19. The light emitting device of claim 18, wherein the insulating layer is disposed under the branch.

20. The light emitting device of claim 15, wherein the insulating layer includes at least one selected from the group consisting of SiO$_2$, SiO$_x$, SiO$_x$N$_y$, Si$_3$N$_4$, Al$_2$O$_3$, MgF$_2$, ZrO$_2$, TaBO$_3$ and TiO$_x$.

* * * * *